(12) United States Patent
Tominari et al.

(10) Patent No.: US 12,068,402 B2
(45) Date of Patent: Aug. 20, 2024

(54) DOPANT PROFILE CONTROL IN HETEROJUNCTION BIPOLAR TRANSISTOR (HBT)

(71) Applicant: TEXAS INSTRUMENTS INCORPORATED, Dallas, TX (US)

(72) Inventors: Tatsuya Tominari, Plano, TX (US); Jerald Rock, Lisbon, ME (US); Hiroshi Yasuda, Plano, TX (US); Wibo Van Noort, Scarborough, ME (US); Mattias Dahlstrom, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 17/538,135

(22) Filed: Nov. 30, 2021

(65) Prior Publication Data

US 2023/0088544 A1 Mar. 23, 2023

Related U.S. Application Data

(60) Provisional application No. 63/246,066, filed on Sep. 20, 2021.

(51) Int. Cl.
*H01L 29/737* (2006.01)
*H01L 29/66* (2006.01)

(52) U.S. Cl.
CPC ...... *H01L 29/737* (2013.01); *H01L 29/66242* (2013.01)

(58) Field of Classification Search
CPC ............ H01L 29/737; H01L 29/66242; H01L 29/0821; H01L 29/165; H01L 29/7378
See application file for complete search history.

(56) References Cited

PUBLICATIONS

Lin; Base Doping Profile Control for SiGe PNP HBTs; Ph.D. Dissertation, The University of British Columbia, 2016. (Year: 2016).*

* cited by examiner

*Primary Examiner* — Syed I Gheyas
(74) *Attorney, Agent, or Firm* — Andrew R. Ralston; Frank D. Cimino (57) ABSTRACT

The present disclosure generally relates to dopant profile control in a heterojunction bipolar transistor (HBT). In an example, a semiconductor device structure includes a semiconductor substrate and an HBT. The HBT includes a collector region, a base region, and an emitter region. The base region is disposed on or over the collector region. The emitter region is disposed on or over the base region. The base region is disposed on or over the semiconductor substrate and includes a heteroepitaxial sub-layer. The heteroepitaxial sub-layer is doped with a dopant. A concentration gradient of the dopant increases from a region in a layer adjoining and overlying the heteroepitaxial sub-layer to a peak concentration in the heteroepitaxial sub-layer without decreasing between the region and the peak concentration.

19 Claims, 5 Drawing Sheets

DOPANT PROFILE CONTROL IN HETEROJUNCTION BIPOLAR TRANSISTOR (HBT)

CROSS-REFERENCE TO RELATED APPLICATIONS

This application claims priority to and the benefit of U.S. Provisional Patent Application Ser. No. 63/246,066, filed on Sep. 20, 2021, which is hereby incorporated herein by reference in its entirety.

BACKGROUND

A heterojunction bipolar transistor (HBT) is generally a bipolar junction transistor (BJT) that implements different semiconductor materials for the emitter region and base region. The emitter region having a different material from the material of the base region creates a heterojunction in the HBT. A HBT can have a high operating frequency, and therefore, can be implemented in high frequency circuits, such as radio frequency (RF) applications.

SUMMARY

An example described herein is a semiconductor device structure including a semiconductor substrate and a heterojunction bipolar transistor. The heterojunction bipolar transistor includes a collector region, a base region, and an emitter region. The base region is disposed on or over the collector region. The emitter region is disposed on or over the base region. The base region is disposed on or over the semiconductor substrate and includes a heteroepitaxial sub-layer. The heteroepitaxial sub-layer is doped with a dopant. A concentration gradient of the dopant increases from a region in a layer adjoining and overlying the heteroepitaxial sub-layer to a peak concentration in the heteroepitaxial sub-layer without decreasing between the region and the peak concentration.

Another example described herein is a method of semiconductor processing. The method includes epitaxially growing a first sub-layer of a base region on or over a collector region, epitaxially growing a second sub-layer of the base region on or over the first sub-layer, and epitaxially growing a third sub-layer of the base region on or over the second sub-layer. The collector region is disposed on or over a semiconductor substrate. Epitaxially growing the second sub-layer includes doping the second sub-layer with a first dopant. Each sub-layer of the first sub-layer, the second sub-layer, and the third sub-layer is epitaxially grown including a semiconductor species. A concentration of the semiconductor species in the first sub-layer is greater than a concentration of the semiconductor species in the second sub-layer. A concentration of the semiconductor species in the third sub-layer is greater than the concentration of the semiconductor species in the second sub-layer.

Another example described herein is a method of semiconductor processing. The method includes forming a collector region on or over a semiconductor substrate, forming a base region on or over the collector region, and forming an emitter region on or over the base region. Forming the base region includes forming a first base sub-layer on or over the collector region, forming a second base sub-layer on or over the first base sub-layer, forming a third base sub-layer on or over the second base sub-layer, forming a fourth base sub-layer on or over the third base sub-layer, forming a fifth base sub-layer on or over the fourth base sub-layer, and forming a cap sub-layer on or over the fifth base sub-layer. A material of the collector region is silicon. A material of the first base sub-layer is silicon germanium. A material of the second base sub-layer is silicon germanium. A concentration of germanium in the second base sub-layer is greater than a concentration of germanium in the first base sub-layer. A material of the third base sub-layer is silicon germanium. A concentration of germanium in the third base sub-layer is less than the concentration of germanium in the second base sub-layer. Epitaxially growing the third base sub-layer includes doping the third base sub-layer with phosphorus. A material of the fourth base sub-layer is silicon germanium. A concentration of germanium in the fourth base sub-layer is greater than the concentration of germanium in the third base sub-layer. A material of the fifth base sub-layer is silicon germanium. A concentration of germanium in the fifth base sub-layer is less than the concentration of germanium in the fourth base sub-layer. A material of the cap sub-layer is silicon.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings, in which.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure generally relates to dopant profile control in a heterojunction bipolar transistor (HBT). Methods of semiconductor processing to fabricate a HBT are described, as well as a semiconductor device structure for implementing a HBT. Various examples described herein may implement a specific materials system and specific dopants. For example, some examples implement a silicon (Si) emitter region and a silicon germanium (SiGe) base sub-layer (hereinafter, "Si/SiGe system" for simplicity) doped with phosphorus (P) or arsenic (As) to achieve a HBT. Hence, these examples achieve a p-type, n-type, p-type (PNP) HBT. It is noted that aspects described herein may apply more generally to different material systems and different dopants.

Si/SiGe systems for HBTs have been observed to have a high operating speed. A higher concentration of germanium in the silicon germanium base sub-layer can result in a higher current gain, and a steep germanium concentration profile can achieve a strong drift field to boost device speed. Further, phosphorus doping with a high concentration in the silicon germanium base sub-layer may have a narrow width without resulting in punch through.

Processing to implement a Si/SiGe system doped with phosphorus for a HBT has been observed to have challenges related to the phosphorus concentration profile. First, segregation diffusion of phosphorus can cause phosphorus to diffuse from a silicon germanium layer that has a higher germanium concentration to an interface between (i) that silicon germanium layer and (ii) a silicon layer or another silicon germanium layer (or sub-layer) that has a lower germanium concentration. Segregation diffusion of phosphorus can occur during processing at any temperature, even at a low temperature. Segregation diffusion of phosphorus may be observed particularly following processing at temperatures greater than 650° C., such as in a range from about 650° C. to about 800° C.

Next, surface segregation of phosphorus has been observed to occur during epitaxial growth of a silicon germanium layer that is in-situ doped with phosphorus during the epitaxial growth. Surface segregation during epitaxial growth of the silicon germanium layer can result in accumulation of phosphorus on the upper surface of the silicon germanium layer.

Additionally, phosphorus has been observed to have a relatively high diffusion mobility in silicon germanium. Particularly, during periods of high thermal stress, phosphorus may diffuse relatively rapidly. Periods of high thermal stress can occur during processing after deposition of the silicon germanium layer that is doped with phosphorus. As an example, in complementary-bipolar and complementary-metal-oxide-semiconductor (CBiCMOS) applications, the silicon germanium layer doped with phosphorus may be subjected to an anneal, such as a rapid thermal anneal (RTA), that is implemented to activate dopants in CMOS components. The HBT can incur a number of thermal stresses after the formation of the base of the HBT due to co-integration of other devices in a CBiCMOS design.

Any of these challenges, and even more when occurring in any combination, can result in a peak concentration of phosphorus being outside of the silicon germanium base sub-layer. This can result in a PN junction being located outside of the silicon germanium base sub-layer, and benefits of an intended heterojunction may not be realized by the HBT.

Various aspects described herein address these challenges. Any aspect can be implemented individually or in combination with others to address one or more of the above challenges. Other challenges can be addressed in contexts of different dopants (e.g., arsenic (As)) and/or other material systems by implementing aspects described herein. According to some examples, a layered structure is deposited to form a base region of an HBT. The layered structure includes at least three sub-layers sequentially epitaxially grown (e.g., the second sub-layer is epitaxially grown on the first sub-layer, and the third sub-layer is epitaxially grown on the second sub-layer). Diffusion of species in the layered structure may result in a lack of a clear demarcation between the sub-layers and may result in a more general heteroepitaxial layer or sub-layer being formed from the sub-layers of the layered structure.

To address segregation diffusion, the epitaxial growth of each sub-layer of the first, second, and third sub-layers is implemented to achieve first, second, and third concentrations, respectively, of a semiconductor species of the respective sub-layer (e.g., germanium with respect to the above-described challenges). Further, the second sub-layer is in-situ doped with a dopant (e.g., phosphorus with respect to the above-described challenges) during epitaxial growth of the second sub-layer, and the first and third sub-layers may not be in-situ doped with the dopant during each's respective epitaxial growth. The concentration of the semiconductor species in each sub-layer of the first and third sub-layers is greater than the concentration of the semiconductor species in the second sub-layer (e.g., colloquially referred to as a "camelback" profile, which may be a camelback germanium profile with respect to the above-described challenges). In the above-described Si/SiGe systems, implementing the concentration of germanium in such a layered structure can cause the dopant (e.g., phosphorus) to be disposed in a sub-layer having a lower germanium concentration where that sub-layer interfaces with sub-layers having higher germanium concentrations. Hence, these interfaces may assist to confine the dopant to the second sub-layer and reduce segregation diffusion outside of a heteroepitaxial layer.

To address surface segregation, epitaxial growth of the second sub-layer (that is doped with the dopant) and the third sub-layer can be performed at a temperature of equal to or less than 650° C., or more specifically, equal to or less than 600° C. More specifically, the epitaxial growth of the second and third sub-layers can be performed at a temperature of 570° C. Reducing the temperature of the epitaxial growth can reduce occurrence of surface segregation. Additionally, the epitaxial growth of the second and third sub-layers can be a selective epitaxial growth (SEG) that uses an etchant gas (e.g., hydrochloric acid (HCl)). The temperature at which the epitaxial growth is performed can be up to 650°

C. with the increased etchant gas flow. Increasing a flow rate of the etchant gas (e.g., regardless of temperature) can remove accumulation of the dopant on the exposed surface thereby reducing accumulation of the dopant on epitaxial growth surfaces.

To address high diffusion mobility, the first and third sub-layers, and possibly, the second sub-layer, can be doped with carbon, such as by in-situ doping during epitaxial growth. The presence of carbon can reduce diffusion of another dopant, such as phosphorus. Hence, carbon in the first and third sub-layers can reduce diffusion of the dopant out of the second sub-layer.

Any of these aspects individually or together with one or more other aspect can achieve a concentration profile of the dopant having a peak concentration within the resulting heteroepitaxial layer or sub-layer, and can reduce the likelihood of, or avoid altogether, a peak concentration of the dopant being outside of the heteroepitaxial layer or sub-layer (which peak concentration would result in a PN junction being improperly outside of the heteroepitaxial layer). Additionally, with respect to Si/SiGe systems, a higher concentration of germanium may be achieved in a silicon germanium base sub-layer such that the HBT can have increased operating speed. As noted above, the above-described aspects may be implemented in any material system and/or any dopants where applicable.

Figure 1:
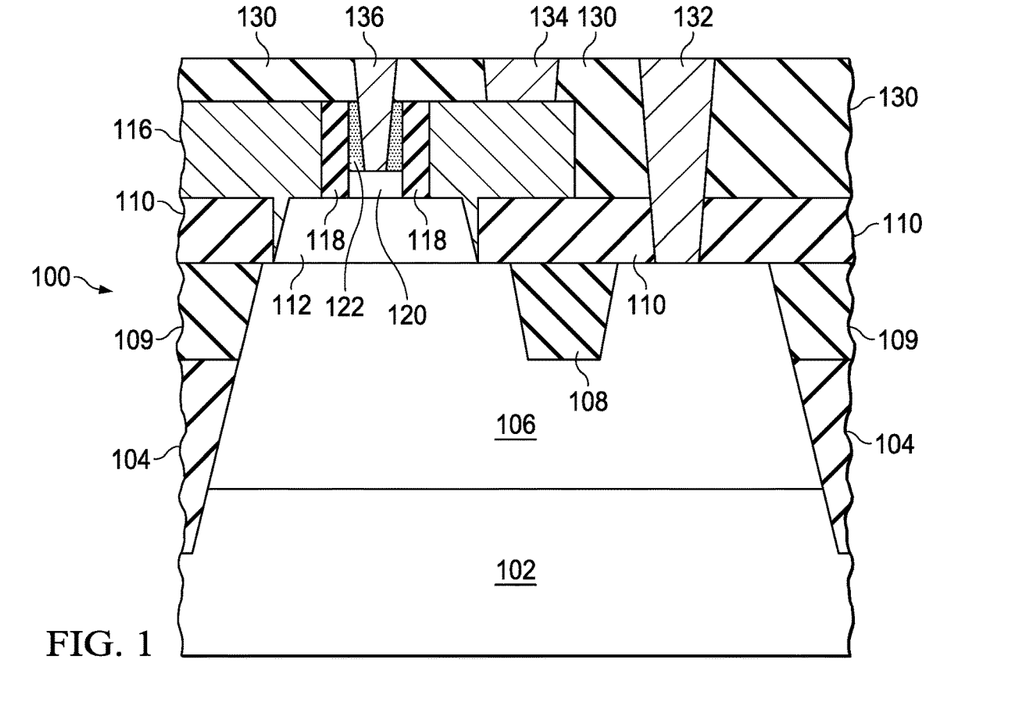
FIG. 1 is a cross-sectional view of a semiconductor device structure according to some examples.

FIG. 1 is a cross-sectional view of a semiconductor device structure 100 according to some examples. The semiconductor device structure 100, in this example, is or includes a bipolar transistor, such as a HBT. The semiconductor device structure 100 is shown generically so as to not obscure aspects described herein. In particular, a number of different dielectric layers or structures may be illustrated and described as a single layer or structure in some instances. It is noted that, in such instances, such multiple different dielectric layers or structures are contemplated within some examples.

The semiconductor device structure 100 includes a semiconductor substrate 102. The semiconductor substrate 102 can be a bulk semiconductor material, a semiconductor-on-insulator (SOI), or any other appropriate semiconductor substrate, and the semiconductor material of the semiconductor substrate 102 can be or include silicon (Si), silicon germanium (SiGe), the like, or a combination thereof. In some examples, the semiconductor substrate 102 is a silicon substrate, which may be singulated from a bulk silicon wafer at the conclusion of semiconductor processing.

Isolation regions 104 are disposed in the semiconductor substrate 102, and each isolation region 104 extends at least from a top (e.g., on and/or in which devices are formed) of the semiconductor substrate 102 to some depth in the semiconductor substrate 102. The isolation regions 104 can be shallow trench isolations (STIs), deep trench isolations (DTIs), local oxidation of semiconductor (LOCOS), or the like. Each isolation region 104 includes a dielectric material, such as an oxide, a nitride, the like, or a combination thereof. One or more isolation regions 104 define an active area on the semiconductor substrate 102 on, over, and/or in which a semiconductor device is to be formed.

A collector region 106 is disposed on the active area of the semiconductor substrate 102. In the illustrated example, the collector region 106 is a semiconductor material epitaxially grown on or over the active area of the semiconductor substrate 102. In other examples, the collector region 106 may be disposed wholly in the semiconductor substrate 102 (e.g., without an epitaxially grown material forming a part of the collector region 106) or at least partially in the semiconductor substrate 102. The semiconductor material of the collector region 106 is crystalline (e.g., monocrystalline) and may be or include silicon (Si), silicon germanium (SiGe), the like, or a combination thereof. In some examples, the collector region 106 is or includes silicon epitaxially grown by SEG on the active area of the semiconductor substrate 102. Epitaxial growth may result in facets being formed as sidewall surfaces of the epitaxially grown material. The formation of facets can depend on the epitaxial growth conditions and the orientation of the crystalline surface on which the epitaxially grown material is grown.

Isolation regions 108, 109 are disposed in and/or defining the collector region 106. The isolation region 108 extends from a surface of the collector region 106 opposite from the semiconductor substrate 102 to some depth in the collector region 106. The isolation regions 109 laterally define the collector region 106 and are above the isolation regions 104 in the semiconductor substrate 102. The isolation regions 108, 109 can be an STI, DTI, or the like. The isolation regions 108, 109 each include a dielectric material, such as an oxide, a nitride, the like, or a combination thereof.

A first dielectric layer 110 is disposed over the isolation regions 108, 109 and the collector region 106. As noted above, the first dielectric layer 110 can include multiple dielectric layers, such as an etch stop layer (e.g., silicon nitride (SiN) or the like) disposed conformally along exposed top and sidewall surfaces and an inter-layer dielectric (e.g., an oxide or the like) disposed on the etch stop layer. The first dielectric layer 110 can be deposited by any appropriate deposition process. The first dielectric layer 110 has a planar top surface (e.g., distal from the semiconductor substrate 102). The planar top surface of the first dielectric layer 110 can be achieved by using a planarization process, such as chemical mechanical polish (CMP), performed on the first dielectric layer 110. An opening is disposed through the first dielectric layer 110 to the collector region 106. The opening can be formed using photolithography and etching processes.

A base region 112 is disposed on the collector region 106 and in the opening through the first dielectric layer 110. As described subsequently, the base region 112 includes multiple semiconductor sub-layers deposited sequentially (e.g., by SEG) in the opening through the first dielectric layer 110. The semiconductor material of each sub-layer of the base region 112 is crystalline (e.g., monocrystalline) and may be or include silicon (Si), silicon germanium (SiGe), the like, or a combination thereof. As also described subsequently, processing following the deposition of the layers of the base region 112 (e.g., high temperature processing, such as an anneal) may result in diffusion of various species of those layers, which may result in demarcations between layers being obscured or removed.

An extrinsic region 116 is disposed on the base region 112 (e.g., on a top surface and/or facets of the base region 112) and on the top surface of the first dielectric layer 110. The extrinsic region 116 is a conductive material for making an electrical connection to the base region 112. The extrinsic region 116, in some examples, is a doped semiconductor material, such as doped polysilicon or doped amorphous silicon. The extrinsic region 116 can be deposited by any appropriate deposition process and patterned by photolithography and etching. An opening is disposed through the extrinsic region 116 to the base region 112. The opening can be formed using photolithography and etching processes.

A dielectric spacer 118 is disposed along the sidewalls of the opening through the extrinsic region 116 and on the base region 112. The dielectric spacer 118 can be formed by conformally depositing one or more dielectric layers in the opening and etching (e.g., anisotropically etching) the one or more dielectric layers such that the dielectric spacer 118 remains. Hence, an opening to the base region 112 is also disposed through the dielectric spacer 118. The dielectric spacer 118 can be or include any appropriate dielectric material, such as silicon nitride (SiN), silicon oxide (SiO), a combination thereof, or the like.

An emitter region 120 is disposed in the opening through the dielectric spacer 118 and on the base region 112. In the illustrated example, the emitter region 120 is a semiconductor material epitaxially grown on the base region 112. The semiconductor material of the emitter region 120 is crystalline (e.g., monocrystalline) and may be or include silicon (Si), silicon germanium (SiGe), the like, or a combination thereof. In some examples, the emitter region 120 is or includes silicon epitaxially grown by SEG on the base region 112 and in the opening through the dielectric spacer 118.

A fill material 122 is disposed on the emitter region 120 and fills the opening through the dielectric spacer 118. The fill material 122 can be a conductive material (such as a doped semiconductor material, like doped polysilicon or doped amorphous silicon) or a dielectric material. The fill material 122 can be deposited using any appropriate deposition process.

A second dielectric layer 130 is disposed over the extrinsic region 116, dielectric spacer 118, fill material 122, and the first dielectric layer 110. As noted above, the second dielectric layer 130 can include multiple dielectric layers, such as an etch stop layer (e.g., silicon nitride (SiN) or the like) disposed conformally along exposed top and sidewall surfaces and an inter-layer or inter-metal dielectric (e.g., an oxide or the like) disposed on the etch stop layer. The second dielectric layer 130 can be deposited by any appropriate deposition process. The second dielectric layer 130 has a planar top surface (e.g., distal from the semiconductor substrate 102). The planar top surface of the second dielectric layer 130 can be achieved by using a planarization process, such as a CMP, on the second dielectric layer 130.

A collector contact 132 is disposed through the second dielectric layer 130 and the first dielectric layer 110 and contacts the collector region 106. An opening through the second dielectric layer 130 and the first dielectric layer 110 can be formed using photolithography and etching processes. The collector contact 132 can then be formed in the opening. The collector contact 132 can include a metal-semiconductor region (e.g., a silicide) at the interface between the collector contact 132 and the collector region 106. The collector contact 132 can include one or more barrier and/or adhesion layers (e.g., titanium nitride, tantalum nitride, the like, or a combination thereof) conformally in the opening, and can include a conductive fill material (e.g., a metal, such as tungsten (W), copper (Cu), a combination thereof, or the like).

A base contact 134 is disposed through the second dielectric layer 130 and contacts the extrinsic region 116. Hence, the base contact 134 is electrically connected to the base region 112. An opening through the second dielectric layer 130 can be formed using photolithography and etching processes. The base contact 134 can then be formed in the opening, similar to the collector contact 132.

An emitter contact 136 is disposed through the second dielectric layer 130 and contacts the emitter region 120 and/or the fill material 122. If the fill material 122 is conductive, the emitter contact 136 may contact the fill material 122 without contacting the emitter region 120 and may be electrically connected to the emitter region 120. An opening through the second dielectric layer 130 and/or fill material 122, can be formed using photolithography and etching processes. The emitter contact 136 can then be formed in the opening, similar to the collector contact 132.

As noted above, in some examples, the semiconductor device structure 100 is or includes a bipolar transistor, and more particularly, a HBT. Subsequent description describes processes and materials for forming the base region 112 illustrated in FIG. 1. In other examples, the collector region 106, base region 112, and emitter region 120 can be incorporated into another semiconductor device structure. Further, subsequent description describes a PNP HBT structure, although in other examples, an NPN HBT structure may be implemented using aspects described herein.

Figure 2:
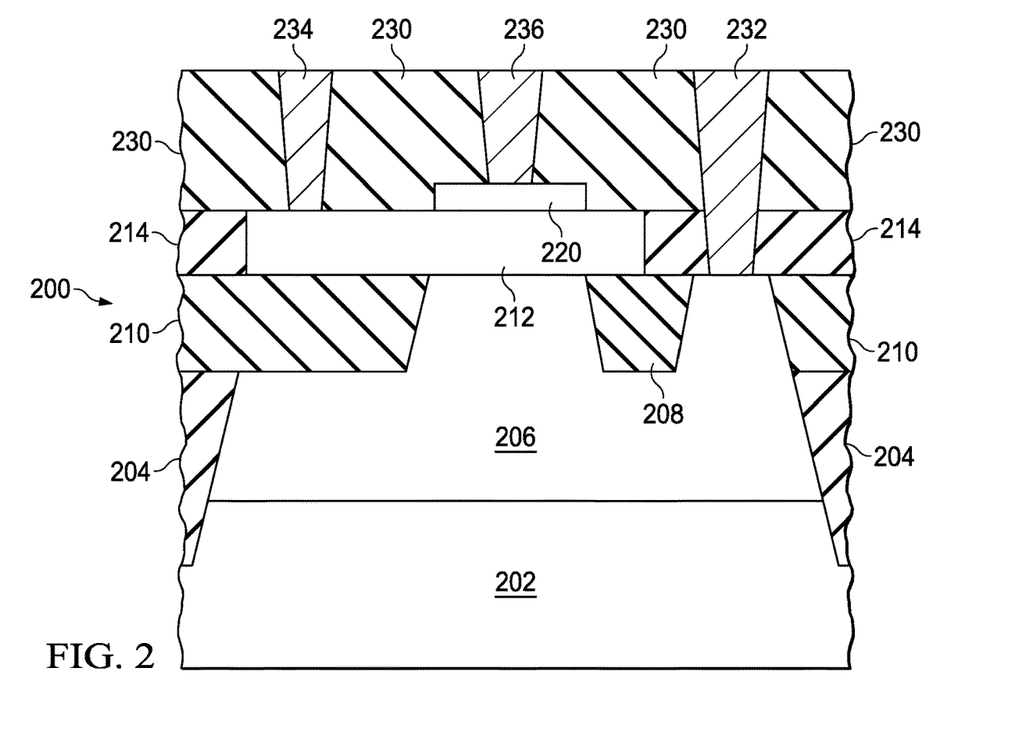
FIG. 2 is a cross-sectional view of a semiconductor device structure according to some examples.

FIG. 2 is a cross-sectional view of a semiconductor device structure 200 according to some examples. The semiconductor device structure 200, in this example, is or includes a bipolar transistor, such as a HBT. Like in FIG. 1, the semiconductor device structure 200 of FIG. 2 is shown generically so as to not obscure aspects described herein. In particular, a number of different dielectric layers or structures may be illustrated and described as a single layer or structure in some instances. It is noted that, in such instances, such multiple different dielectric layers or structures are contemplated within some examples.

The semiconductor device structure 200 includes a semiconductor substrate 202 like the semiconductor substrate 102 in FIG. 1. Isolation regions 204, such as DTIs, STIs, or the like, are disposed in the semiconductor substrate 202, and each isolation region 204 extends at least from a top (e.g., on and/or in which devices are formed) of the semiconductor substrate 202 to some depth in the semiconductor substrate 202. The isolation regions 204 can be like the isolation regions 104 in FIG. 1. One or more isolation regions 204 define an active area on the semiconductor substrate 202 on, over, and/or in which a semiconductor device is to be formed.

A collector region 206 is disposed on or over the active area of the semiconductor substrate 202. In the illustrated example, the collector region 206 is a semiconductor material epitaxially grown on or over the active area of the semiconductor substrate 202. In other examples, the collector region 206 may be disposed wholly in the semiconductor substrate 202 (e.g., without an epitaxially grown material forming a part of the collector region 206) or at least partially in the semiconductor substrate 202. The collector region 206 may be like the collector region 106 in FIG. 1.

Isolation regions 208, 210 (e.g., STIs or the like) are disposed in and/or defining the collector region 206. The isolation region 208 extends from a surface of the collector region 206 opposite from the semiconductor substrate 202 to some depth in the collector region 206. The isolation regions 210 laterally define the collector region 206 and are above the isolation regions 204 in the semiconductor substrate 202. The isolation regions 208, 210 can be like the isolation regions 108, 109 in FIG. 1.

A base region 212 is disposed on or over the collector region 206 and at least partially on or over the isolation region 208 and at least one of the isolation regions 210. As described subsequently, the base region 212 includes multiple semiconductor sub-layers deposited sequentially (e.g., by a blanket epitaxial growth) on or over the collector region 206 and at least partially on or over the isolation region 208 and at least one of the isolation regions 210. The base region 212 can be epitaxially grown by a blanket deposition and etched using photolithography techniques to form the base region 212 having the structure shown in FIG. 2, for example. The semiconductor material of each sub-layer of the base region 212 is crystalline (e.g., monocrystalline) and may be or include silicon (Si), silicon germanium (SiGe), the like, or a combination thereof. As also described subsequently, processing following the deposition of the layers of the base region 212 (e.g., high temperature processing, such as an anneal) may result in diffusion of various species of those layers, which may result in demarcations between layers being obscured or removed.

A first dielectric layer 214 is disposed on or over the isolation regions 210 and at least partially on or over the collector region 206. As noted above, the first dielectric layer 214 can include multiple dielectric layers, such as an etch stop layer (e.g., silicon nitride (SiN) or the like) disposed conformally along exposed top and sidewall surfaces and an inter-layer dielectric (e.g., an oxide or the like) disposed on the etch stop layer. The first dielectric layer 214 can be deposited by any appropriate deposition process. Respective top surfaces of the first dielectric layer 214 and the base region 212 are substantially co-planar. For example, a planarization process, such as CMP, can be performed to planarize the first dielectric layer 214 and the base region 212.

An emitter region 220 is disposed on or over the base region 212. In the illustrated example, the emitter region 220 is a semiconductor material epitaxially grown on the base region 212. The semiconductor material of the emitter region 220 is crystalline (e.g., monocrystalline) and may be or include silicon (Si), silicon germanium (SiGe), the like, or a combination thereof. In some examples, the emitter region 220 is or includes silicon epitaxially grown by a blanket epitaxial growth process on the base region 212 and etched using photolithography techniques to form the emitter region 220 having the structure shown in FIG. 2, for example.

A second dielectric layer 230 is disposed on or over the first dielectric layer 214, the base region 212, and the emitter region 220. As noted above, the second dielectric layer 230 can include multiple dielectric layers, such as an etch stop layer (e.g., silicon nitride (SiN) or the like) disposed conformally along exposed top and sidewall surfaces and an inter-layer or inter-metal dielectric (e.g., an oxide or the like) disposed on the etch stop layer. The second dielectric layer 230 can be deposited by any appropriate deposition process. The second dielectric layer 230 has a planar top surface (e.g., distal from the semiconductor substrate 202). The planar top surface of the second dielectric layer 230 can be achieved by using a planarization process, such as a CMP, on the second dielectric layer 230.

A collector contact 232 is disposed through the second dielectric layer 230 and the first dielectric layer 214 and contacts the collector region 206. The collector contact 232 is electrically connected to the collector region 206. A base contact 234 is disposed through the second dielectric layer 230 and contacts the base region 212. Hence, the base contact 234 is electrically connected to the base region 212. An emitter contact 236 is disposed through the second dielectric layer 230 and contacts the emitter region 220. Hence, the emitter contact 236 is electrically connected to the emitter region 220. The collector contact 232, base contact 234, and emitter contact 236 can be formed like the collector contact 132, base contact 134, and emitter contact 136 in FIG. 1.

As noted above, in some examples, the semiconductor device structure 200 is or includes a bipolar transistor, and more particularly, a HBT. Subsequent description describes processes and materials for forming the base region 212 illustrated in FIG. 2. In other examples, the collector region 206, base region 212, and emitter region 220 can be incorporated into another semiconductor device structure. Further, subsequent description describes a PNP HBT structure, although in other examples, an NPN HBT structure may be implemented using aspects described herein.

Figure 3:
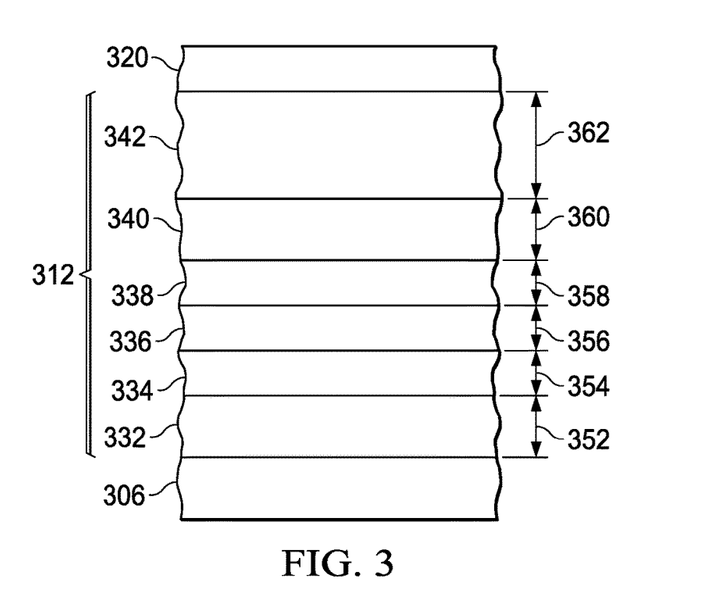
FIG. 3 is a cross-sectional view of a layered structure of a base region according to some examples.

FIG. 3 illustrates a cross-sectional view of a layered structure of a base region 312 according to some examples. A first base sub-layer 332 of the base region 312 is disposed on or over a collector region 306. A second base sub-layer 334 of the base region 312 is disposed on or over the first base sub-layer 332. A third base sub-layer 336 of the base region 312 is disposed on or over the second base sub-layer 334. A fourth base sub-layer 338 of the base region 312 is disposed on or over the third base sub-layer 336. A fifth base sub-layer 340 of the base region 312 is disposed on or over the fourth base sub-layer 338. A cap sub-layer 342 of the base region 312 is disposed on or over the fourth base sub-layer 338. The emitter region 320 is disposed on or over the cap sub-layer 342.

The collector region 306, the base region 312, and the emitter region 320 of FIG. 3 can be the collector region 106, the base region 112, and the emitter region 120, respectively, in FIG. 1, in some examples. The collector region 306, the base region 312, and the emitter region 320 of FIG. 3 can be the collector region 206, the base region 212, and the emitter region 220, respectively, in FIG. 2, in some examples.

The first base sub-layer 332 has a thickness 352 (e.g., in a direction normal to the major surface of the semiconductor substrate 102). The second base sub-layer 334 has a thickness 354. The third base sub-layer 336 has a thickness 356. The fourth base sub-layer 338 has a thickness 358. The fifth base sub-layer 340 has a thickness 360. The cap sub-layer 342 has a thickness 362.

In some examples, the thicknesses 354, 356, 358 of the second, third, and fourth base sub-layers 334, 336, 338 are approximately equal. In some examples, the thicknesses 352, 360 of the first and fifth base sub-layers 332, 340 are approximately equal. In some examples, each of the thicknesses 354, 356, 358 of the second, third, and fourth base sub-layers 334, 336, 338 is less than each of the thicknesses 352, 360 of the first and fifth base sub-layers 332, 340. The thickness 362 of the cap sub-layer 342 in some examples is greater than the thicknesses 352, 354, 356, 358, 360. In some examples, the thicknesses 354, 356, 358 of the second, third, and fourth base sub-layers 334, 336, 338 can be in a range from about 2 nm to about 10 nm. In some examples, the thicknesses 352, 360 of the first and fifth base sub-layers 332, 340 can be in a range from about 5 nm to about 40 nm. In some examples, the thickness 362 of the cap sub-layer 342 can be in a range from about 10 nm to about 50 nm. Although various thicknesses and relations between thicknesses of layers have been given as examples, any appropriate thickness can be implemented for a given sub-layer.

The base sub-layers 332, 334, 336, 338, 340 and the cap sub-layer 342 are each an appropriate semiconductor material and are each also crystalline (e.g., monocrystalline). The base sub-layers 332, 334, 336, 338, 340 may also be doped with appropriate dopants. The base sub-layers 332, 334, 336, 338, 340 are deposited (e.g., epitaxially grown) with at least one semiconductor species that is different from or generally not included in the collector region 306, the cap sub-layer 342, and/or the emitter region 320. The at least one semiconductor species results in the base sub-layers 332, 334, 336, 338, 340 (or a resulting heteroepitaxial layer, as described subsequently) forming a heterojunction with, e.g., the cap sub-layer 342 and/or the emitter region 320. In the examples that are described in the context of Si/SiGe systems, the semiconductor species is germanium. Hence, description of concentrations or concentration gradients in the context of germanium below are more generically applicable to a semiconductor species. Similarly, the base region 312 and the emitter region 320 are doped with dopants that form a PN junction at or near the heterojunction. In the examples that are described in the context of a PNP HBT (using the Si/SiGe system) below, the dopant that is used to dope one or more of the base sub-layers 332, 334, 336, 338, 340 of the base region 312 is an n-type dopant, and more specifically, phosphorus. Other n-type dopants, such as arsenic (As) in a Si/SiGe system or other n-type dopants for other material systems, can be used to dope the base region 312. In other examples in the context of a NPN HBT, a p-type dopant (e.g., having a conductivity type opposite from an n-type dopant) can be used to dope the base region 312. Hence, description of concentrations or concentration gradients in the context of phosphorus below are more generically applicable to a dopant (e.g., a conductivity dopant, such as an n-type dopant or a p-type dopant).

In some examples, the first and fifth base sub-layers 332, 340 are silicon germanium, $Si_{1-x}Ge_x$, where $0 \leq x \leq 1$; the second and fourth base sub-layers 334, 338 are silicon germanium, $Si_{1-y}Ge_y$, where $0 \leq y \leq 1$; the third base sub-layer 336 is silicon germanium, $Si_{1-z}Ge_z$, where $0 \leq z \leq 1$; and the collector region 306, the cap sub-layer 342, and the emitter region 320 are each silicon. In some examples, the third base sub-layer 336 is doped with phosphorus. Additionally, in some examples, the second and fourth base sub-layers 334, 338, and possibly, the third base sub-layer 336, are each doped with carbon. Carbon may be omitted in some examples, such as where a dopant other than phosphorus is implemented.

Figure 4:
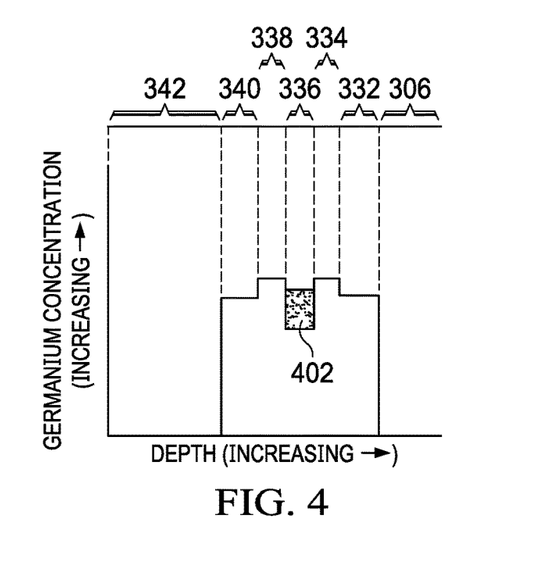
FIGS. 4 and 5 are charts depicting different target concentration profiles of germanium within the layered structure of FIG. 3 according to some examples.
Figure 5:
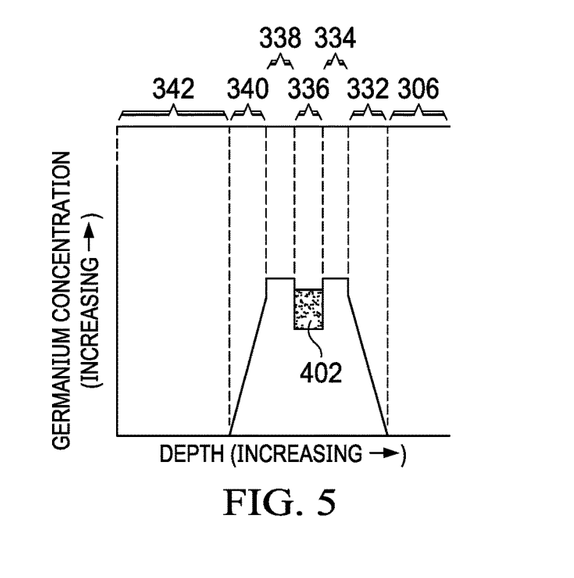
Figure 6:
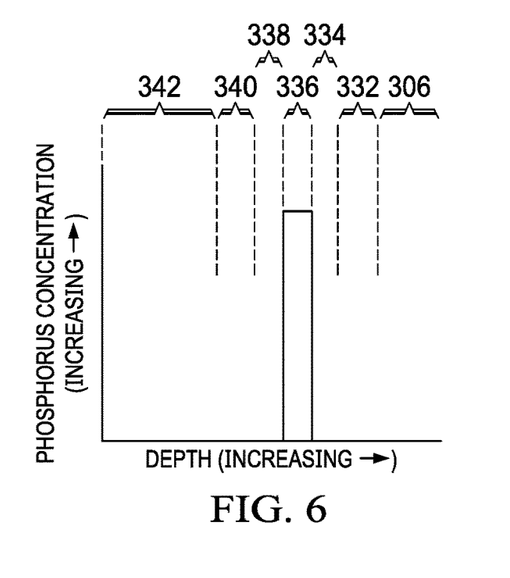
FIGS. 6 and 7 are charts depicting target concentration profiles phosphorus and carbon, respectively, within the layered structure of FIG. 3 according to some examples.
Figure 7:
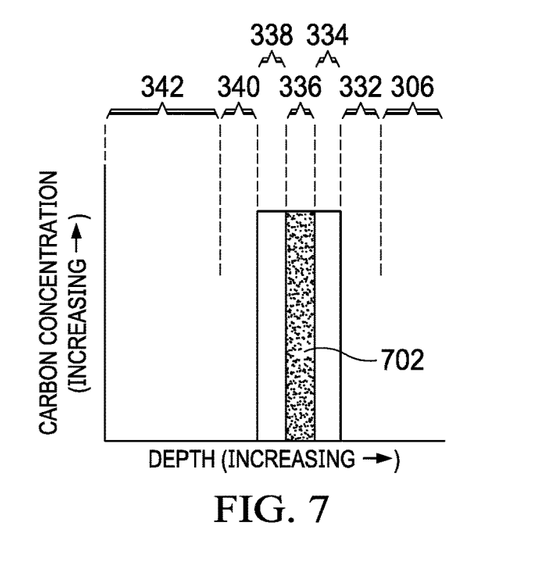

FIGS. 4 and 5 are charts depicting different target concentration profiles of germanium within the layered structure of FIG. 3 according to some examples. FIGS. 6 and 7 are charts depicting target concentration profiles of phosphorus and carbon, respectively, within the layered structure of FIG. 3 according to some examples. The various target concentrations are the concentrations that respective epitaxial growth processes of the sub-layers are designed to achieve, although diffusion of species may not actually result in the target concentrations being achieved uniformly in the respective sub-layers by the epitaxial growth processes. A concentration of germanium can result from the crystalline deposition of germanium that forms the respective sub-layer by the epitaxial growth process. A concentration of phosphorus and a concentration of carbon can result from in-situ doping during the respective epitaxial growth process.

With reference to FIGS. 4 and 5, the target concentration of germanium in the first base sub-layer 332 (e.g., x) is less than the target concentration of germanium in the second base sub-layer 334 (e.g., y). The target concentration of germanium in the second base sub-layer 334 (e.g., y) is greater than the target concentration of germanium in the third base sub-layer 336 (e.g., z). The target concentration of germanium in the third base sub-layer 336 (e.g., z) may be less than, equal to, or greater than the target concentration of germanium in the first base sub-layer 332 (e.g., x), which is illustrated by region 402, for example. Similarly, the target concentration of germanium in the fifth base sub-layer 340 (e.g., x) is less than the target concentration of germanium in the fourth base sub-layer 338 (e.g., y). The target concentration of germanium in the fourth base sub-layer 338 (e.g., y) is greater than the target concentration of germanium in the third base sub-layer 336 (e.g., z). The target concentration of germanium in the third base sub-layer 336 (e.g., z) may be less than, equal to, or greater than the target concentration of germanium in the fifth base sub-layer 340 (e.g., x), which is also illustrated by region 402. The target concentrations of germanium in the cap sub-layer 342 and in the collector region 306 is zero. Although the target concentrations of germanium in the first and fifth base sub-layers 332, 340 are indicated as being equal, these target concentrations may, in some instances, not be equal, and although the target concentrations of germanium in the second and fourth base sub-layers 334, 338 are indicated as being equal, these target concentrations may, in some instances, not be equal.

The target concentrations of germanium in the base sub-layers 332-340 in FIG. 4 are uniform throughout the respective sub-layer. The target concentrations of germanium in the second, third, and fourth base sub-layers 334, 336, 338 in FIG. 5 are uniform throughout the respective sub-layer. In FIG. 5, the target concentration of germanium in the first base sub-layer 332 increases (e.g., linearly) from the interface between the collector region 306 and the first base sub-layer 332 to the interface between the first base sub-layer 332 and the second base sub-layer 334. Similarly, in FIG. 5, the target concentration of germanium in the fifth base sub-layer 340 decreases (e.g., linearly) from the interface between the fourth base sub-layer 338 and the fifth base sub-layer 340 to the interface between the fifth base sub-layer 340 and the cap sub-layer 342.

The value of x for the target concentration of germanium in the first and fifth base sub-layers 332, 340 (e.g., the peak target concentration when not uniform like in FIG. 5) can be in a range from about 0.15 to about 0.25. The value of y for the target concentration of germanium in the second and fourth base sub-layers 334, 338 can be in a range from about 0.2 to about 0.35. The value of z for the target concentration of germanium in the third base sub-layer 336 can be in a range from about 0.15 to about 0.3.

With reference to FIG. 6, the target concentration of phosphorus in the third base sub-layer 336 is greater than the target concentration of phosphorus in each of the first, second, fourth, and fifth base sub-layers 332, 334, 338, 340. In some examples, the target concentration of phosphorus in each of the first, second, fourth, and fifth base sub-layers 332, 334, 338, 340 and the cap sub-layer 342 is substantially zero. In some examples, the target concentration of phosphorus in the third base sub-layer 336 is in a range from about $8 \times 10^{18}$ cm$^{-3}$ to about $8 \times 10^{19}$ cm$^{-3}$.

With reference to FIG. 7, the target concentrations of carbon in the second and fourth base sub-layers 334, 338, and possibly in the third base sub-layer 336, are greater than the target concentration of carbon in each of the first and fifth base sub-layers 332, 340. The target concentration of carbon in the third base sub-layer 336 can be equal to or less than the target concentrations of carbon in the second and fourth base sub-layers 334, 338, as illustrated by region 702. In some examples, the target concentration of carbon in each of the first and fifth base sub-layers 332, 340 and the cap sub-layer 342 is substantially zero, and in some examples, any or each of the first and fifth base sub-layers 332, 340 and the cap sub-layer 342 can include carbon. In some examples, the target concentrations of carbon in the second, third, and fourth base sub-layers 334, 336, 338 is in a range from about $7.5 \times 10^{19}$ cm$^{-3}$ to about $1.5 \times 10^{20}$ cm$^{-3}$.

Tables 1 and 2 below list thicknesses and target concentrations of species to illustrate some examples. Other examples can implement other thicknesses, other target concentrations, and/or other species.

TABLE 1

| | Thickness | Germanium Concentration | Phosphorus Concentration | Carbon Concentration |
|---|---|---|---|---|
| Collector Region 306 | Not Specified | 0 (Si) | 0 | 0 |
| First Base Sub-Layer 332 | 7 nm | $x = 0.225$ $(Si_{0.775}Ge_{0.225})$ | 0 | 0 |
| Second Base Sub-Layer 334 | 5 nm | $y = 0.26$ $(Si_{0.74}Ge_{0.26})$ | 0 | $1.5 \times 10^{20}$ cm$^{-3}$ |
| Third Base Sub-Layer 336 | 5 nm | $z = 0.18$ $(Si_{0.82}Ge_{0.18})$ | $4 \times 10^{19}$ cm$^{-3}$ | $1.5 \times 10^{20}$ cm$^{-3}$ |
| Fourth Base Sub-Layer 338 | 5 nm | $y = 0.26$ $(Si_{0.74}Ge_{0.26})$ | 0 | $1.5 \times 10^{20}$ cm$^{-3}$ |
| Fifth Base Sub-Layer 340 | 7 nm | $x = 0.225$ $(Si_{0.775}Ge_{0.225})$ | 0 | 0 |
| Cap Sub-Layer 342 | 20 nm | 0 (Si) | 0 | 0 |

TABLE 2

| | Thickness | Germanium Concentration | Phosphorus Concentration | Carbon Concentration |
|---|---|---|---|---|
| Collector Region 306 | Not Specified | 0 (Si) | 0 | 0 |
| First Base Sub-Layer 332 | 7 nm | $x = 0.23$ $(Si_{0.77}Ge_{0.23})$ | 0 | 0 |
| Second Base Sub-Layer 334 | 9 nm | $y = 0.31$ $(Si_{0.69}Ge_{0.31})$ | 0 | $7.5 \times 10^{19}$ cm$^{-3}$ |
| Third Base Sub-Layer 336 | 5 nm | $z = 0.27$ $(Si_{0.73}Ge_{0.27})$ | $2.4 \times 10^{19}$ cm$^{-3}$ | $7.5 \times 10^{19}$ cm$^{-3}$ |
| Fourth Base Sub-Layer 338 | 7 nm | $y = 0.31$ $(Si_{0.69}Ge_{0.31})$ | 0 | $7.5 \times 10^{19}$ cm$^{-3}$ |
| Fifth Base Sub-Layer 340 | 10 nm | $x = 0.23$ $(Si_{0.77}Ge_{0.23})$ | 0 | 0 |
| Cap Sub-Layer 342 | 20 nm | 0 (Si) | 0 | 0 |

Figure 8:
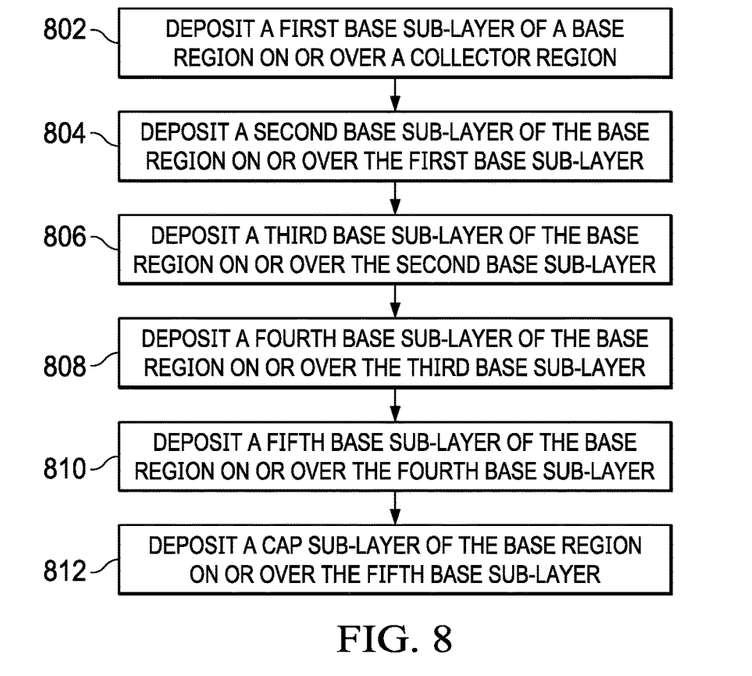
FIG. 8 is a flow chart of a method of forming the layered structure of FIG. 3 according to some examples.

FIG. 8 is a flow chart of a method of forming the layered structure of FIG. 3 according to some examples. At block 802, the first base sub-layer 332 of the base region 312 is deposited on or over the collector region 306. At block 804, the second base sub-layer 334 of the base region 312 is deposited on or over the first base sub-layer 332. At block 806, the third base sub-layer 336 of the base region 312 is deposited on or over the second base sub-layer 334. At block 808, the fourth base sub-layer 338 of the base region 312 is deposited on or over the third base sub-layer 336. At block 810, the fifth base sub-layer 340 of the base region 312 is deposited on or over the fourth base sub-layer 338. At block 812, the cap sub-layer 342 of the base region 312 is deposited on or over the fifth base sub-layer 340.

In some examples, each of the depositions of blocks 802-812 is epitaxial growth, and more particularly, SEG in some examples and blanket epitaxial growth in other examples. Epitaxial growth can be implemented by a low pressure chemical vapor deposition (LPCVD) or any other appropriate process. Any appropriate process conditions and precursor gases can be used during the epitaxial growth to achieve target thicknesses of the sub-layers 332-342 and target concentrations of species in the sub-layers 332-342.

Continuing the examples described above where the base sub-layers 332-340 are silicon germanium, a SEG for epitaxially growing these base sub-layers 332-340 can include a silicon-containing precursor gas, a germanium-containing precursor gas, and an etchant gas. In some examples, a recipe for selectively growing these base sub-layers 332-340 includes using dichlorosilane ($SiH_2Cl_2$) and/or silane ($SiH_4$) as the silicon-containing precursor gas (and possibly also as a co-etchant gas), germane ($GeH_4$) as the germanium-containing precursor gas, and hydrochloric acid (HCl) as the etchant gas. Further, a dopant-containing gas can be implemented during the epitaxial growth of a given layer to in-situ dope that layer. In some examples, phosphine ($PH_3$) or arsine ($AsH_3$) can be used during the epitaxial growth of the third base sub-layer 336 to in-situ dope the third base sub-layer 336 with phosphorus. In some examples, a carbon-containing gas, such as mono-methylsilane ($CSiH_6$), dimethylsilane ($C_2H_8Si$), or trimethylsilane ($C_3H_{10}Si$), can be used during the epitaxial growth of the respective second, third, and/or fourth base sub-layer 334, 336, 338 to in-situ dope that sub-layer with carbon. The SEG can implement target flow rates of the various gases and other process conditions to achieve target thicknesses and target concentrations of the various ones of the base sub-layers 332-340, such as described above.

Further, continuing the examples described above where the cap sub-layer 342 is silicon, a SEG for epitaxially growing the cap sub-layer 342 can include a silicon-containing precursor gas and an etchant gas. In some examples, a recipe for selectively growing the cap sub-layer 342 includes using dichlorosilane ($SiH_2Cl_2$) as the silicon-containing precursor gas (and also as a co-etchant gas) and hydrochloric acid (HCl) as the etchant gas. The SEG can implement target flow rates of the various gases and other process conditions to achieve target thicknesses and target concentrations of the cap sub-layer 342, such as described above.

Figure 9:
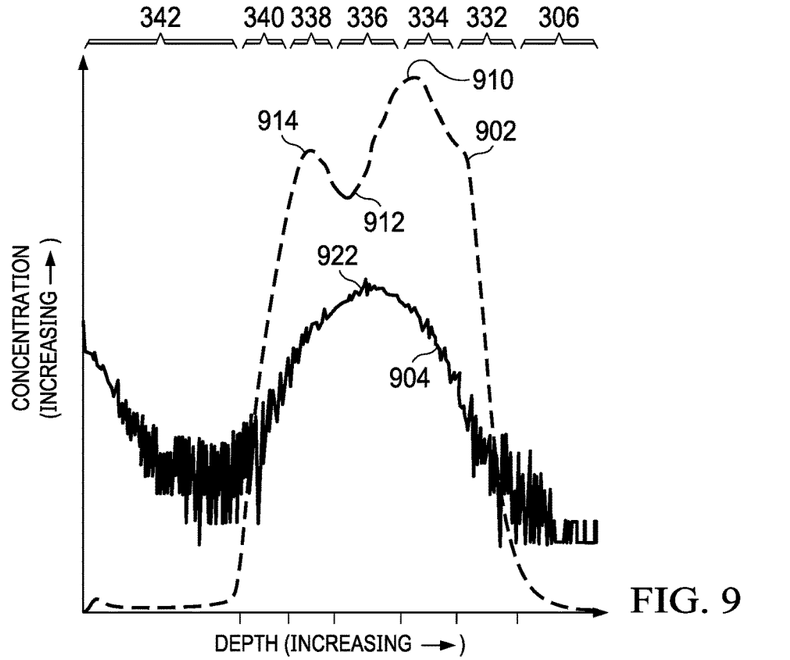
FIG. 9 is a chart depicting concentration gradients of germanium, phosphorus, and carbon within the layered structure of FIG. 3 according to some examples.

As deposited, species within the sub-layers 332-342 of the base region 312 may diffuse. FIG. 9 is a chart depicting concentrations of species within the sub-layers 332-342 according to some examples. FIG. 9 shows a germanium concentration gradient 902 and a phosphorus concentration gradient 904. The sub-layers 332-342 were deposited using target concentrations consistent with what is shown in and described with respect to FIGS. 4 and/or 5 and FIG. 6. The concentration gradients of species in FIG. 9 are shown after deposition of the sub-layers 332-342 and without significant additional processing (e.g., without any high temperature processing). The germanium concentration gradient 902 is shown on a linear scale and is described in the context of a value of n, were $Si_{1-n}Ge_n$ and $0 \leq n \leq 1$. The phosphorus concentration gradient 904 is shown on a logarithmic scale. It is noted that description of increases and decreases of concentration gradients herein is without consideration of effects of noise in the signal used to obtain and represent the respective concentration gradient.

The germanium concentration gradient 902 increases from an interface between the first base sub-layer 332 and the collector region 306 to a peak concentration 910 in the second base sub-layer 334. Then, from the peak concentration 910, the germanium concentration gradient 902 decreases to a valley concentration 912 in the third base sub-layer 336. From the valley concentration 912, the germanium concentration gradient 902 increases to a peak concentration 914 in the fourth base sub-layer 338, and then decreases from the peak concentration 914 to the interface between the fifth base sub-layer 340 and the cap sub-layer 342. In some examples, the collector region 306 does not include germanium in a substantial amount prior to deposition of, e.g., the first base sub-layer 332 because the collector region 306 may not have been directly exposed to a germanium-containing precursor or material. It is contemplated that the collector region 306 may have trace or insubstantial amounts of germanium prior to deposition of the first base sub-layer 332 due to, e.g., indirect or insubstantial exposure to germanium. After deposition of the first base sub-layer 332, germanium may diffuse some amount from the first base sub-layer 332 into the collector region 306, as shown by the germanium concentration gradient 902.

The phosphorus concentration gradient 904 increases (e.g., by over one order of magnitude) from a region within the first base sub-layer 332 to a peak concentration 922 in the third base sub-layer 336. From the peak concentration 922, the phosphorus concentration gradient 904 decreases (e.g., by over one order of magnitude) to a region within the fifth base sub-layer 340. The phosphorus concentration gradient 904 approximates a Gaussian distribution with the peak concentration 922 in the third base sub-layer 336.

As shown by FIGS. 4 and/or 5 and FIGS. 6 and 9, phosphorus doped in the third base sub-layer 336 is disposed between two interfaces where the germanium concentration in the third base sub-layer 336 is lower relative to the concentration of germanium in the neighboring sub-layers, e.g., the second and fourth base sub-layers 334, 338. With respect to FIGS. 4, 5, and 6, the target concentration of germanium is lower in the third base sub-layer 336 than in each sub-layer of the second and fourth base sub-layers 334, 338, and the third base sub-layer 336 is doped with phosphorus. With respect to FIG. 9, an increasing germanium concentration gradient 902 is from the third base sub-layer 336 to the second base sub-layer 334 (e.g., from valley concentration 912 to peak concentration 910), and an increasing germanium concentration gradient 902 is from the third base sub-layer 336 to the fourth base sub-layer 338 (e.g., from valley concentration 912 to peak concentration 914). The peak concentration 922 of phosphorus is also disposed in the third base sub-layer 336. By having phosphorus disposed between these interfaces of increasing germanium concentration or between these increasing germanium concentration gradients, the effects of segregation diffusion may be better contained to within the base sub-layers 332-340 (that will form a heteroepitaxial base sub-layer described subsequently), which can help prevent a peak concentration of phosphorus from occurring outside of the base sub-layers 332-340.

Similarly, phosphorus doped in the third base sub-layer 336 is disposed between the second and fourth base sub-layers 334, 338 that are each doped with carbon. The presence of carbon can reduce phosphorus diffusion mobility, such as during periods of thermal stress. Hence, by having phosphorus disposed between sub-layers doped with carbon, the effects of diffusion, particularly, when occurring during thermal stress, may be reduced so that more phosphorus remains within the third base sub-layer 336. Hence, carbon doping as described can help prevent a peak concentration of phosphorus from occurring outside of the base sub-layers 332-340.

Figure 10:
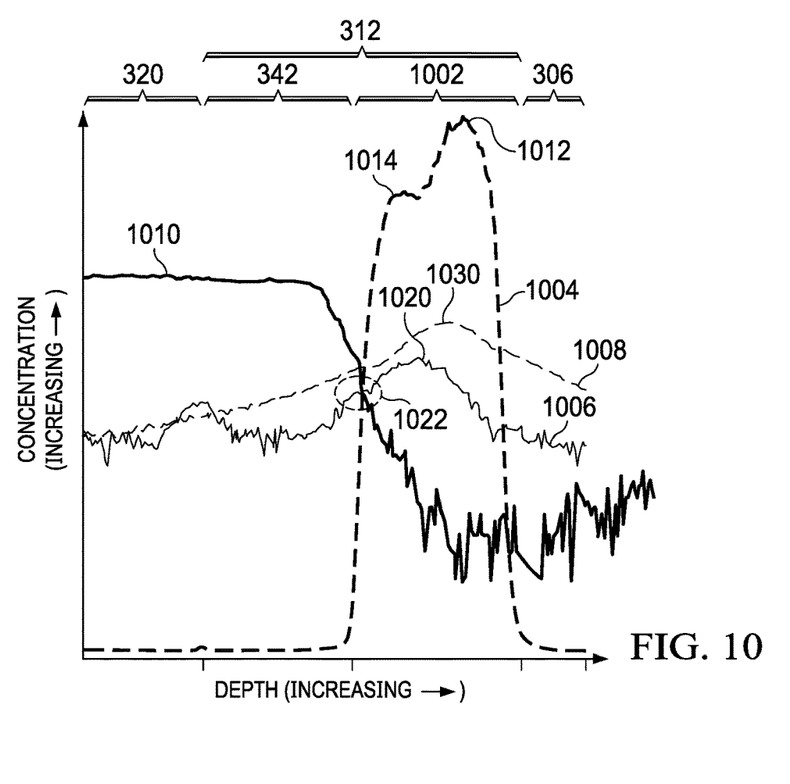
FIG. 10 is a chart depicting concentrations gradients of germanium, phosphorus, carbon, and boron within a collector region, base region, and emitter region according to some examples.

After deposition of the sub-layers 332-342 of the base region 312, additional processing can be performed on, e.g., the wafer that comprises the semiconductor substrate 102. For example, high temperature processing can be performed on the wafer. Specifically, in some processing, an anneal process, such as a rapid thermal anneal, can be performed on the wafer. The anneal process may be implemented to activate dopants, e.g., of CMOS components. An example anneal process includes an 850° C. bake in hydrogen ($H_2$) for two minutes and a nitrogen ($N_2$) spike rapid thermal anneal (RTA) at a temperature of 1,080° C. for CMOS source/drain activation and emitter drive. This high temperature processing can cause further diffusion of species in the base region 312. The base region 312 can incur a number of thermal stresses after the formation of the base region 312 due to co-integration of other devices in a CBiCMOS design. FIG. 10 is a chart depicting concentrations of species within the collector region 306, base region 312, and emitter region 320 according to some examples. The concentrations of species shown in FIG. 10 have been obtained after subsequent processing, such as up to singulating the die that is or includes the semiconductor substrate 102, 202 from the remainder of the wafer.

Figure 11:
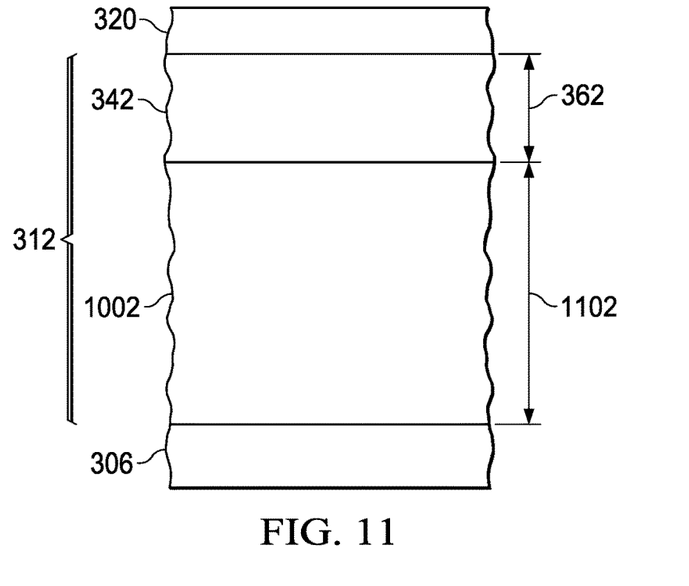
FIG. 11 is a cross-sectional view of a heteroepitaxial base sub-layer resulting within the layered structure according to some examples.

Diffusion of the species may result in the loss of clear demarcations between as-deposited base sub-layers 332-340. The diffusion of the species, as illustrated in FIG. 10, may result in a more general heteroepitaxial base sub-layer 1002 formed as a result of the diffusion of species among and between the base sub-layers 332-340. FIG. 11 illustrates a cross-sectional view of the resulting heteroepitaxial base sub-layer 1002 in the layered structure of the base region 312 according to some examples. As illustrated, the heteroepitaxial base sub-layer 1002 is disposed on or over the collector region 306, and the cap sub-layer 342 is disposed on or over the heteroepitaxial base sub-layer 1002. The heteroepitaxial base sub-layer 1002 has a thickness 1102 that is the combined (e.g., summed) thicknesses 352, 354, 356, 358, 360 of the base sub-layers 332-340.

Referring back to FIG. 10 and continuing from the example of FIG. 9, FIG. 10 shows a germanium concentration gradient 1004, a phosphorus concentration gradient 1006, a carbon concentration gradient 1008, and a boron concentration gradient 1010. Boron is used here as an example of a p-type dopant. The germanium concentration gradient 1004 is shown on a linear scale and is described in the context of a value of n, were $Si_{1-n}Ge_n$ and $0 \leq n \leq 1$. The phosphorus concentration gradient 1006, the carbon concentration gradient 1008, and the boron concentration gradient 1010 are shown on a logarithmic scale. It is noted that description of increases and decreases of concentration gradients herein is without consideration of effects of noise in the signal used to obtain and represent the respective concentration gradient.

The germanium concentration gradient 1004 increases from the interface between the heteroepitaxial base sub-layer 1002 and the collector region 306 to a peak concentration 1012 in the heteroepitaxial base sub-layer 1002. From the peak concentration 1012, the germanium concentration gradient 1004 decreases to a plateau concentration 1014 in the heteroepitaxial base sub-layer 1002, and from the plateau concentration 1014, continues to decrease to the interface between the heteroepitaxial base sub-layer 1002 and the cap sub-layer 342. In some examples, the germanium concentration gradient 1004 can continuously decrease from the peak concentration 1012 to the interface between the heteroepitaxial base sub-layer 1002 and the cap sub-layer 342. In other examples, the germanium concentration gradient 1004 can (1) decrease from the peak concentration 1012 to a valley concentration in the heteroepitaxial base sub-layer 1002, (2) increase from the valley concentration to a second peak concentration in the heteroepitaxial base sub-layer 1002, and (3) decrease from the second peak concentration to the interface between the heteroepitaxial base sub-layer 1002 and the cap sub-layer 342. In some examples, not having a valley concentration of germanium in the heteroepitaxial base sub-layer 1002 can avoid a barrier being in the heteroepitaxial base sub-layer 1002. A valley concentration of germanium can create a reduction of electron mobility in the heteroepitaxial base sub-layer 1002, and therefore, can create a barrier.

The phosphorus concentration gradient 1006 increases (e.g., by approximately one order of magnitude) from a region within the collector region 306 to a peak concentration 1020 in the heteroepitaxial base sub-layer 1002. The peak concentration 1020 in the heteroepitaxial base sub-layer 1002 is located some depth away from the interface between the cap sub-layer 342 and the heteroepitaxial base sub-layer 1002, such as greater than 10%, 20%, and/or 25% of the thickness 1102 of the heteroepitaxial base sub-layer 1002 from the interface. From the peak concentration 1020, the phosphorus concentration gradient 1006 decreases (e.g., by approximately one-half order of magnitude) to the interface between the heteroepitaxial base sub-layer 1002 and the cap sub-layer 342 and continues to decrease to a region within the cap sub-layer 342.

From another perspective, the phosphorus concentration gradient 1006 increases from a mid-point (e.g., mid-depth) of the cap sub-layer 342 to the peak concentration 1020 in the heteroepitaxial base sub-layer 1002 without decreasing therebetween. More focused, within a region of the cap sub-layer 342 proximate to the heteroepitaxial base sub-layer 1002 (e.g., 10%, 20%, and/or 25% of the cap sub-layer 342 proximate to or adjoining the heteroepitaxial base sub-layer 1002) to the peak concentration 1020 in the heteroepitaxial base sub-layer 1002, the phosphorus concentration gradient 1006 does not decrease. The phosphorus concentration gradient 1006 may stop increasing for a short depth (e.g., a plateau concentration) or the rate of increase may decrease (e.g., in a logarithmic scale), particularly, at the interface between the cap sub-layer 342 and the heteroepitaxial base sub-layer 1002. FIG. 10 shows a small portion 1022 of the phosphorus concentration gradient 1006 at the interface between the cap sub-layer 342 and the heteroepitaxial base sub-layer 1002 where the rate of increase decreases some before the rate of increase increases at a further depth in the heteroepitaxial base sub-layer 1002. As shown, no peak concentration of phosphorus concentration gradient 1006 is disposed from the region of the cap sub-layer 342 proximate to the heteroepitaxial base sub-layer 1002 to the interface between the cap sub-layer 342 and the heteroepitaxial base sub-layer 1002. Further, no peak concentration of phosphorus concentration gradient 1006 is disposed from the region of the cap sub-layer 342 proximate to the heteroepitaxial base sub-layer 1002 to the peak concentration 1020 disposed at the depth away from the interface between the cap sub-layer 342 and the heteroepitaxial base sub-layer 1002.

The carbon concentration gradient 1008 increases (e.g., by less than one order of magnitude) from the interface between the collector region 306 and the heteroepitaxial base sub-layer 1002 to a peak concentration 1030 in the heteroepitaxial base sub-layer 1002. From the peak concentration 1030, the carbon concentration gradient 1008 decreases (e.g., by less than one order of magnitude) to the interface between the heteroepitaxial base sub-layer 1002 and the cap sub-layer 342.

The boron concentration gradient 1010 is substantially uniform in the emitter region 320 and substantially through the cap sub-layer 342. The boron concentration gradient 1010 decreases in the cap sub-layer 342 proximate the heteroepitaxial base sub-layer 1002 and continues to decrease into the heteroepitaxial base sub-layer 1002. The boron concentration gradient 1010 is low at subsequent depths through the heteroepitaxial base sub-layer 1002.

The concentration of phosphorus (as shown by the phosphorus concentration gradient 1006) is equal to the concentration of boron (as shown by the boron concentration gradient 1010) at or near the interface between the cap sub-layer 342 and the heteroepitaxial base sub-layer 1002. At a depth corresponding to the peak concentration 1020 of the phosphorus concentration gradient 1006, the concentration of phosphorus is greater than, such as by one or more orders of magnitude, the concentration of boron. Through the cap sub-layer 342 distal from the heteroepitaxial base sub-layer 1002 and throughout the emitter region 320, the concentration of boron (as shown by the boron concentration gradient 1010) is greater than, such as by one or more orders of magnitude, the concentration of phosphorus (as shown by the phosphorus concentration gradient 1006). These concentrations of boron and phosphorous can result in a PN junction being formed within the heteroepitaxial base sub-layer 1002.

To illustrate the effects of diffusion, the illustrative concentrations at various peak concentrations, valley concentrations, and plateau concentrations are provided. For germanium, at the interfaces between (1) the first base sub-layer 332 and the collector region 306, (2) the fifth base sub-layer 340 and the cap sub-layer 342, (3) the heteroepitaxial base sub-layer 1002 and the collector region 306, and (4) the heteroepitaxial base sub-layer 1002 and the cap sub-layer 342, the concentration of germanium is approximately 0 (e.g., n≈0). The concentration of germanium at peak concentration 910 in FIG. 9 is approximately 0.28 (e.g., n≈0.28); the concentration of germanium at valley concentration 912 is approximately 0.212 (e.g., n≈0.212); and the concentration of germanium at peak concentration 914 is approximately 0.237 (e.g., n 0.237). The concentration of germanium at peak concentration 1012 in FIG. 10 is approximately 0.28 (e.g., n≈0.28), and the concentration of germanium at plateau concentration 1014 is approximately 0.243 (e.g., n≈0.243).

For phosphorus, at the interface between the first base sub-layer 332 and the collector region 306 in FIG. 9, the concentration of phosphorus is at or less than $10^{17}$ cm$^{-3}$, and at the interface between the fifth base sub-layer 340 and the cap sub-layer 342, the concentration of phosphorus is at or less than $10^{17}$ cm$^{-3}$. At the peak concentration 922 in FIG. 9, the concentration of phosphorus is approximately $2\times10^{19}$ cm$^{-3}$. At the interface between the heteroepitaxial base sub-layer 1002 and the collector region 306 in FIG. 10, the concentration of phosphorus is approximately $2\times10^{18}$ cm$^{-3}$, and at the interface between the heteroepitaxial base sub-layer 1002 and the cap sub-layer 342 (e.g., near portion 1022), the concentration of phosphorus is approximately $5\times10^{18}$ cm$^{-3}$. At the peak concentration 1020 in FIG. 10, the concentration of phosphorus is approximately $1\times10^{19}$ cm$^{-3}$.

Figure 12:
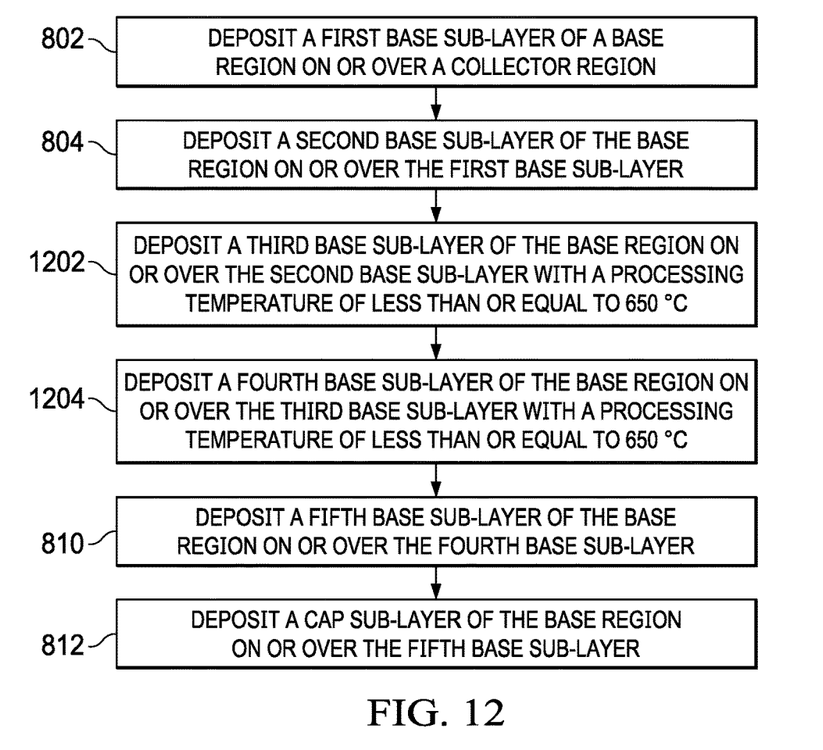
FIG. 12 is a flow chart of another method of forming the layered structure of FIG. 3 according to some examples.

FIG. 12 is a flow chart of another method of forming the layered structure of FIG. 3 according to some examples. Like in FIG. 8, at block 802, the first base sub-layer 332 of the base region 312 is deposited on or over the collector region 306. At block 804, the second base sub-layer 334 of the base region 312 is deposited on or over the first base sub-layer 332. At block 1202, the third base sub-layer 336 of the base region 312 is deposited on or over the second base sub-layer 334 with a process temperature of less than or equal to 650° C., and in some examples, less than or equal to 600° C. (such as approximately 570° C.). At block 1204, the fourth base sub-layer 338 of the base region 312 is deposited on or over the third base sub-layer 336 with a process temperature of less than or equal to 650° C., and in some examples, less than or equal to 600° C. (such as approximately 570° C.). At block 810, the fifth base sub-layer 340 of the base region 312 is deposited on or over the fourth base sub-layer 338. At block 812, the cap sub-layer 342 of the base region 312 is deposited on or over the fifth base sub-layer 340. The temperature of the epitaxial growth (e.g., SEG) of the first, second, and fifth base sub-layers 332, 334, 340 and the cap sub-layer 342 can be any appropriate temperature, such as greater than 650° C.

It has been observed that reducing the epitaxial growth (e.g., SEG) temperature of the third and fourth base sub-layers 336, 338 to less than or equal to 650° C., and more specifically, less than or equal to 600° C., can reduce occurrence of surface segregation of phosphorus with which the third base sub-layer 336 is doped (e.g., in-situ doped). Using this lower temperature to epitaxially grow the third and fourth base sub-layers 336, 338 can reduce accumulation of phosphorus on an epitaxial growth surface. Hence, reducing such accumulation of phosphorus can further facilitate the phosphorus concentration gradient shown in FIG. 10 without a peak concentration of phosphorus being outside of the heteroepitaxial base sub-layer.

Further, it has been observed that the growth rate of silicon germanium decreases with a decrease in epitaxial growth temperature and increases with an increase in germanium concentration. Hence, in some examples, implementing a higher germanium concentration for the third and fourth base sub-layers 336, 338 consistent with the above description to achieve a higher growth rate can at least to some extent offset or overcome the decrease in growth rate resulting from the decrease in temperature.

As an example, the SEG to deposit the first, second, and fifth base sub-layers 332, 334, 340 in blocks 802, 804, 810 of FIG. 12 can use an epitaxial growth temperature of 630° C.; the SEG to deposit the third and fourth base sub-layers 336, 338 in blocks 1202, 1204 of FIG. 12 can use an epitaxial growth temperature of 570° C.; and the SEG to deposit the cap sub-layer 342 in block 812 of FIG. 12 can use an epitaxial growth temperature of 750° C.

Additionally, increasing the flow rate of an etchant gas, such as hydrochloric acid (HCl), during a SEG of the third and fourth base sub-layers 336, 338 can remove accumulation of phosphorus from the epitaxial growth surface. The etchant gas can therefore also reduce occurrence of surface segregation. For higher temperatures, such as between 600° C. and 650° C., a higher flow rate of the etchant gas can be used. In some examples, a flow rate of the etchant gas can be in a range from about 15 standard cubic centimeter (sccm) to about 40 sccm. In an example, SEG at block 1202 is performed at a temperature of 650° C. with a flow rate of the etchant gas of 25 sccm, and SEG at block 1204 is performed at a temperature of 650° C. with a flow rate of the etchant gas of 40 sccm. In another example, SEG at block 1202 is performed at a temperature of 600° C. with a flow rate of the etchant gas of 25 sccm, and SEG at block 1204 is performed at a temperature of 600° C. with a flow rate of the etchant gas of 15 sccm. The flow rate of the etchant gas can increase with increasing epitaxial growth temperature and can vary depending on the germanium concentration implemented by the epitaxial growth.

Another benefit of the aspects described above is that, for a Si/SiGe system, a higher concentration of germanium in a silicon germanium sub-layer can be implemented. Without aspects described herein, having a higher concentration of germanium could cause more segregation diffusion and surface segregation of phosphorus. With the above described aspects, the effects of these challenges can be mitigated while achieving an increased concentration of germanium in the silicon germanium sub-layer. Having this increased concentration of germanium can result in increased electron mobility and higher operating speeds of the HBT.

Although various examples have been described in detail, it should be understood that various changes, substitutions, and alterations can be made therein without departing from the scope defined by the appended claims.

What is claimed is:

1. A method of forming an integrated circuit, the method comprising:
    epitaxially growing a first sub-layer of a base region on or over a collector region, the first sub-layer having a first uniform concentration of a semiconductor species, the collector region being disposed on or over a semiconductor substrate;
    epitaxially growing a second sub-layer of the base region on or over the first sub-layer, the second sub-layer having a second uniform concentration of the semiconductor species, said epitaxially growing the second sub-layer comprising doping the second sub-layer with a first dopant; and
    epitaxially growing a third sub-layer of the base region on or over the second sub-layer, the third sub-layer having a third uniform concentration of the semiconductor species, the second concentration less than the first concentration and less than the third concentration.

2. The method of claim 1, wherein epitaxially growing each sub-layer of the first sub-layer and the third sub-layer comprises doping the respective sub-layer with a second dopant different from the first dopant.

3. The method of claim 2, wherein the second dopant is carbon.

4. The method of claim 1, wherein the first dopant is an n-type dopant.

5. The method of claim 4, wherein the n-type dopant is phosphorus, arsenic, or a combination thereof.

6. The method of claim 1, wherein epitaxially growing each sub-layer of the first sub-layer and the third sub-layer does not include doping the respective sub-layer with the first dopant.

7. The method of claim 1, wherein the semiconductor species is germanium.

8. The method of claim 1, wherein epitaxially growing each sub-layer of the second sub-layer and the third sub-layer is performed at a respective temperature less than or equal to 650° C.

9. The method of claim 8, wherein epitaxially growing each sub- layer of the second sub-layer and the third sub-layer is performed at a respective temperature of about 570° C.

10. The method of claim 1 further comprising:
epitaxially growing a fourth sub-layer of the base region on or over the collector region, the first sub-layer being epitaxially grown on or over the fourth sub-layer;
epitaxially growing a fifth sub-layer of the base region on or over the third sub-layer, wherein each sub-layer of the fourth sub-layer and the fifth sub-layer is epitaxially grown with the semiconductor species, a concentration of the semiconductor species in the fourth sub-layer being less than the concentration of the semiconductor species in the first sub-layer, a concentration of the semiconductor species in the fifth sub-layer being less than the concentration of the semiconductor species in the third sub-layer;
epitaxially growing a cap sub-layer of the base region on or over the fifth sub-layer; and
epitaxially growing an emitter region on or over the cap sub-layer.

11. A method of forming a transistor of an integrated circuit, the method comprising:
forming a collector region on or over a semiconductor substrate, a material of the collector region being silicon;
forming a base region on or over the collector region, forming the base region comprising:
forming a first base sub-layer on or over the collector region, a material of the first base sub-layer being silicon germanium;
forming a second base sub-layer on or over the first base sub-layer, a material of the second base sub-layer being silicon germanium, a concentration of germanium in the second base sub-layer being greater than a concentration of germanium in the first base sub-layer;
forming a third base sub-layer on or over the second base sub-layer, a material of the third base sub-layer being silicon germanium, a concentration of germanium in the third base sub-layer being less than the concentration of germanium in the second base sub-layer, epitaxially growing the third base sub-layer includes doping the third base sub-layer with phosphorus;
forming a fourth base sub-layer on or over the third base sub-layer, a material of the fourth base sub-layer being silicon germanium, a concentration of germanium in the fourth base sub-layer being greater than the concentration of germanium in the third base sub-layer;
forming a fifth base sub-layer on or over the fourth base sub-layer, a material of the fifth base sub-layer being silicon germanium, a concentration of germanium in the fifth base sub-layer being less than the concentration of germanium in the fourth base sub-layer; and
forming a cap sub-layer on or over the fifth base sub-layer, a material of the cap sub-layer being silicon; and
forming an emitter region on or over the base region.

12. The method of claim 11, wherein forming each sub-layer of the second base sub-layer and the fourth base sub-layer includes doping the respective sub-layer with carbon.

13. The method of claim 11, wherein forming each sub-layer of the third base sub-layer and the fourth base sub-layer is performed at a respective temperature less than or equal to 650° C.

14. The method of claim 11, wherein forming each sub-layer of the third base sub-layer and the fourth base sub-layer is a respective selective epitaxial growth that includes using an etchant gas.

15. A method of forming an integrated circuit including a heterojunction bipolar transistor (HBT), the method comprising:
forming a base region of the HBT, the base region located on or over a collector region of the HBT and including silicon and germanium, the HBT located over a semiconductor substrate having a top surface, the base region having a germanium concentration along a direction orthogonal to the top surface that has first and second local maxima of the germanium concentration, and a local minimum of the germanium concentration between the first and second local maxima.

16. A method of forming an integrated circuit, the method comprising:
epitaxially growing a first sub-layer of a base region on or over a collector region if a heterojunction bipolar transistor, the collector region being disposed on or over a semiconductor substrate and having a first germanium concentration;
epitaxially growing a second sub-layer of the base region on or over the first sub-layer, the second sub-layer having a second germanium concentration less than the first germanium concentration; and
epitaxially growing a third sub-layer of the base region on or over the second sub-layer, the third sub-layer having a third germanium concentration greater than the second germanium concentration.

17. A method of forming an integrated circuit, comprising:
forming a first semiconductor region having a first conductivity type extending into a semiconductor substrate having a top surface;
forming a compound semiconductor region having an opposite second conductivity type over the first semiconductor region, the compound semiconductor region having first and second semiconductor species, a concentration of the second semiconductor species along a direction orthogonal to the top surface having first and second local maxima and a local minimum between the first and second local maxima, wherein the first semiconductor species is silicon and the second semiconductor species is germanium; and
forming a second semiconductor region having the first conductivity type over the compound semiconductor region.

18. The method as recited in claim 17, wherein the first semiconductor region is a collector of a heterojunction bipolar transistor (HBT), the compound semiconductor region is a base of the HBT and the second semiconductor region is an emitter of the HBT.

19. The method as recited in claim 17, wherein the compound semiconductor region includes a first sublayer between the first local maximum and the first semiconductor region, and a second sublayer between the second local maximum and the second semiconductor region, the first and second sublayers having a concentration of the second semiconductor species greater than the local minimum concentration.

* * * * *